(12) United States Patent
Kwak

(10) Patent No.: US 11,255,875 B2
(45) Date of Patent: Feb. 22, 2022

(54) SYSTEM AND METHOD FOR DETERMINING DISTANCE OF FREE FALL

(71) Applicant: STMicroelectronics Asia Pacific Pte Ltd., Singapore (SG)

(72) Inventor: Heejun Kwak, Seoul (KR)

(73) Assignee: STMICROELECTRONICS ASIA PACIFIC PTE LTD., Singapore (SG)

( * ) Notice: Subject to any disclaimer, the term of this patent is extended or adjusted under 35 U.S.C. 154(b) by 0 days.

(21) Appl. No.: 16/793,544

(22) Filed: Feb. 18, 2020

(65) Prior Publication Data
US 2021/0255215 A1    Aug. 19, 2021

(51) Int. Cl.
  *G01P 15/18* (2013.01)
  *B81B 3/00* (2006.01)
  *G01P 15/08* (2006.01)
  *G11B 19/04* (2006.01)

(52) U.S. Cl.
  CPC ............ *G01P 15/18* (2013.01); *B81B 3/0018* (2013.01); *G01P 15/0891* (2013.01); *G11B 19/04* (2013.01); *B81B 2201/0235* (2013.01)

(58) Field of Classification Search
  CPC ...... G01P 15/0891; G01P 15/18; G01P 15/08; G11B 19/04; G11B 19/042; G11B 19/043; G11B 19/20
  See application file for complete search history.

(56) References Cited

U.S. PATENT DOCUMENTS

| 4,862,394 | A | * | 8/1989 | Thompson | G01D 9/005 702/166 |
| 5,835,298 | A | * | 11/1998 | Edgerton | G11B 19/02 360/75 |
| 5,982,573 | A | * | 11/1999 | Henze | G11B 5/54 360/60 |
| 7,369,345 | B1 | * | 5/2008 | Li | G11B 5/5582 360/73.03 |
| 7,395,709 | B2 | * | 7/2008 | Noda | G01P 15/18 360/75 |
| 7,450,332 | B2 | | 11/2008 | Pasolini et al. | |
| 7,578,184 | B2 | | 8/2009 | Fontanella et al. | |
| 7,793,544 | B2 | | 9/2010 | Merassi et al. | |

(Continued)

FOREIGN PATENT DOCUMENTS

WO    2019170525 A1    9/2019

OTHER PUBLICATIONS

Clifford, Michelle, "Detecting Freefall with Low-G Accelerometers," NXP Application, Freescale Semicondutor, AN3151 Rev 0, Nov. 2006, 8 pages.

(Continued)

*Primary Examiner* — Helen C Kwok
(74) *Attorney, Agent, or Firm* — Slater Matsil, LLP

(57) ABSTRACT

A sensor includes a MEMS element responsive to acceleration, an analog-to-digital converter coupled to an output of the MEMS element, and a free fall detector coupled to an output of the analog-to-digital converter. The free fall detector is configured to determine whether the sensor is in free fall based on acceleration information received from the analog-to-digital converter. A digital interface is coupled to the analog-to-digital converter and to an output of the free fall detector and is configured to issue an output related to free fall information determined by the free fall detector.

19 Claims, 7 Drawing Sheets

(56) References Cited

U.S. PATENT DOCUMENTS

| | | | | |
|---|---|---|---|---|
| 8,612,810 | B2* | 12/2013 | Roselli | G06F 1/1613 |
| | | | | 714/709 |
| 8,885,285 | B1* | 11/2014 | Nicholls | G11B 19/043 |
| | | | | 360/75 |
| 8,903,519 | B2 | 12/2014 | King et al. | |
| 9,138,174 | B2* | 9/2015 | Jin | A61B 5/0002 |
| 10,746,643 | B1* | 8/2020 | Bentley | G01N 3/303 |
| 2006/0152842 | A1* | 7/2006 | Pasolini | G11B 19/04 |
| | | | | 360/75 |
| 2006/0268447 | A1* | 11/2006 | Liao | G01P 15/18 |
| | | | | 360/75 |
| 2007/0291398 | A1* | 12/2007 | Hara | G11B 19/04 |
| | | | | 360/75 |
| 2009/0031803 | A1* | 2/2009 | Noda | G01P 15/18 |
| | | | | 73/488 |
| 2009/0187370 | A1* | 7/2009 | Pasolini | G01P 15/00 |
| | | | | 702/141 |
| 2011/0215940 | A1* | 9/2011 | Bartholomeyczik | |
| | | | | G11B 19/043 |
| | | | | 340/669 |
| 2013/0054180 | A1* | 2/2013 | Barfield | G01P 15/0891 |
| | | | | 702/138 |
| 2013/0073095 | A1* | 3/2013 | King | H04M 1/185 |
| | | | | 700/279 |
| 2013/0257582 | A1* | 10/2013 | Rothkopf | G06F 1/1656 |
| | | | | 340/3.1 |
| 2016/0054354 | A1* | 2/2016 | Keal | G01P 15/16 |
| | | | | 702/141 |
| 2017/0372585 | A1* | 12/2017 | Iv Evangelista | G01C 19/00 |

OTHER PUBLICATIONS

Dang, Tran Tri, et al., "Automatic Fall Detection using Smartphone Acceleration Sensor," International Journal of Advanced Computer Science and Applications (IJACSA), vol. 7, No. 12, 2016, 7 pages.

Habib, Mohammad Ashfak, et al., "Smartphone-Based Solutions for Fall Detection and Prevention: Challenges and Open Issues," Sensors, ISSN 1424-8220, 14, 7181-7208; doi:10.3390/s140407181, published Apr. 22, 2014, 28 pages.

Hackster, "Free Fall Detection Using 3-Axis Accelerometer," https://www.hackster.io/RVLAD/free-fall-detection-using-3-axis-accelerometer-06383e, Jun. 15, 2019, 8 pages.

Lim, Dongha, et al., "Fall-Detection Algorithm Using 3-Axis Acceleration: Combination with Simple Threshold and Hidden Markov Model," Journal of Applied Mathematics, vol. 2014, Article ID 896030, published Sep. 17, 2014, 6 pages.

Stmicroelectronics, "iNEMO inertial module: always-on 3D accelerometer and 3D gyroscope", LSM6DSO Datasheet, DS12140—Rev 2—Jan. 2019, 172 pages.

Stmicroelectronics, "LSM6DCO: Finite State Machine", Application note, AN5226—Rev 1—Jan. 2019, 67 pages.

Stmicroelectronics, "LSM6DSO: always-on 3D accelerometer and 3D gyroscope", Application note, AN5192—Rev 4, Jul. 2019, 135 pages.

* cited by examiner

SYSTEM AND METHOD FOR DETERMINING DISTANCE OF FREE FALL

TECHNICAL FIELD

The present invention relates generally to a system and method for determining the distance of a free fall.

BACKGROUND

Portable electronic devices, such as for example smart phones, laptops, digital audio players, digital cameras and the like, can readily be subject to violent impact, in particular in the case where they are dropped on the ground during their normal use.

In order to prevent, or at least limit, the occurrence of destructive events, it has been proposed to use linear accelerometers, fixed to the portable apparatus, to detect a free fall condition of the portable apparatus. The free fall condition is detected by appropriate processing of the acceleration signals generated by the accelerometer, and in particular by verifying that the acceleration detected along all the measurement axes is zero.

Linear accelerometer devices are known, built using semiconductor technology, such as MEMS (Micro-Electro-Mechanical-Systems) technology. In the past, accelerometer devices have been arranged within the portable apparatus in a position outside a hard disk, which is particularly sensitive to damage. The accelerometer can be coupled to the electronic circuit controlling the general operation of the portable apparatus to alert the device to lock the read head of the hard disk drive.

SUMMARY

Embodiments disclosed herein provide a system and method for determining the distance of a free fall. Embodiments can provide advantages and solve problems found in the prior art.

In a first embodiment, a method can be used to calculate information useful in determining a distance of free fall. A sensor attached to an object is used to measure an acceleration value of the object, the measuring being performed by a sensor attached to the object. It is determined whether the object is in free fall based on the acceleration value. When the object is in free fall, the following steps can be performed: issuing an increment signal in response to determining that the object is in free fall, the increment signal being issued synchronously with a clock signal, incrementing a counter in response to each issuance of the increment signal, measuring a further acceleration value of the object using the sensor, determining whether a shock is detected based on the further acceleration value, and repeating these steps until a shock is detected.

In another embodiment, a sensor can be utilized. The sensor comprises a MEMS element responsive to acceleration, an analog-to-digital converter coupled to an output of the MEMS element, and a free fall detector coupled to an output of the analog-to-digital converter. The free fall detector is configured to determine whether the sensor is in free fall based on acceleration information received from the analog-to-digital converter. A digital interface is coupled to the analog-to-digital converter and to an output of the free fall detector and is configured to issue an output related to free fall information determined by the free fall detector.

Another embodiment provides an object, such as a smart phone. The object comprises clock circuitry, an acceleration sensor configured to determine whether the object is in free fall at points in time synchronous with a clock signal of the clock circuitry, and a microcontroller coupled to the acceleration sensor through a digital bus. The microcontroller is configured to receive an interrupt signal from the acceleration sensor at each point in time that the acceleration sensor determines that the object is in free fall and to increment a counter in response to each interrupt signal.

Other embodiments are disclosed herein and will be apparent based on the detailed description.

BRIEF DESCRIPTION OF THE DRAWINGS

For a more complete understanding of the present invention, and advantages thereof, reference is now made to the following descriptions taken in conjunction with the accompanying drawings, in which.

Figure 1:
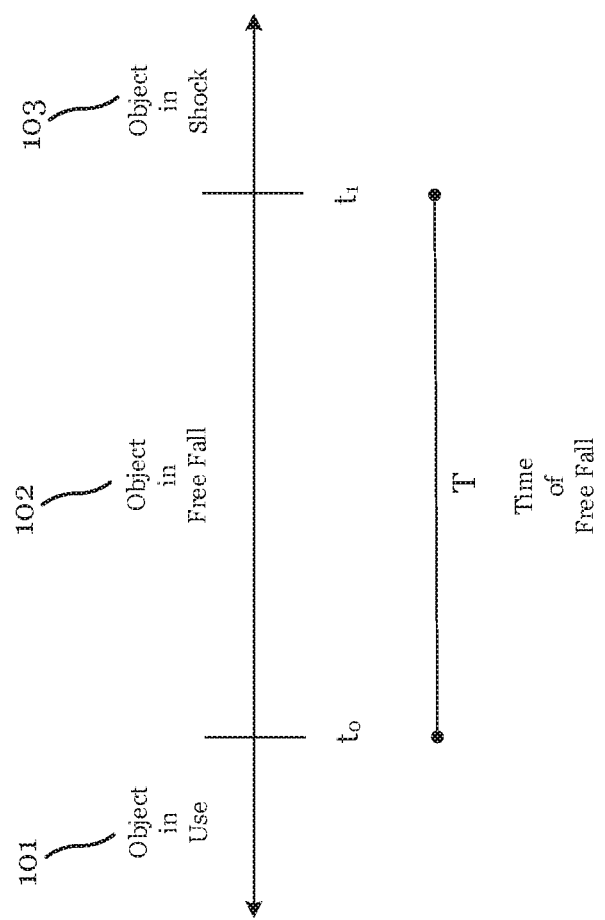
FIG. 1 shows a timeline describing the characteristic signatures an object may experience during a period of free fall, in accordance with an embodiment of the present invention.

The drawings are merely representations, not intended to portray specific parameters of the invention. The drawings are intended to depict only specific embodiments of the inventions, and therefore should not be considered as limiting in scope. In the drawings, like numbering represents like elements.

DETAILED DESCRIPTION OF ILLUSTRATIVE EMBODIMENTS

The method and using of various embodiments of a system and method for determining free fall conditions are discussed in detail below. However, it should be valued that the various embodiments detailed herein may be applicable in a wide variety of disciplines. The specific embodiments described herein are merely illustrative of specific ways to make and use various embodiments, and should not be construed in a limited scope.

In many instances, physical damage to an electronic device may be the direct result of some varying degree of shock (i.e., mechanical impact) sustained by an object. Often times, damage-induced shock is preceded by an event in which the object has been dropped, such as a free fall event.

Useful detection methods for such free fall events, especially ones resulting in damage to an object, can prove to be quite advantageous.

For example, with certain troubleshooting needs, it may be useful to understand the occurrence of events leading up to the damage sustained by the object. In which case, extracting data related to the object's fall, such as the dropping distance or the moment shock (i.e., mechanical impact) was detected, may provide useful information.

Accordingly, embodiments of the invention discussed herein will describe a system and a method for determining the distance (i.e., drop height) of a free fall event. These embodiments may offer further insight for root cause analysis regarding the nature of an object's damage—as certain signs of damage may be characteristic of high shock, preceding a free fall event.

A free fall event is a natural phenomenon described as a state of falling under the influence of gravity, wherein gravity is the only force acting upon an object. While there exist three recognized categories of free falling events—linear, rotational, and projectile—exemplary embodiments of the invention discussed herein will predominately focus on linear free fall events although concepts discussed herein can apply to any free fall.

In the event a dynamic change in the object's orientation is detected during the free fall, other embodiments of the invention may be configured to accommodate for greater functionality. Depending upon the desired application, the additional functionality may accommodate for more robust data extraction methods and analysis of other free fall categories (i.e., rotational, projectile).

FIG. 1 shows a timeline describing the characteristic signatures an object may experience during a period of free fall.

Prior to an initial time $t_0$, an object may be in use (period 101), for example, being operated by a user. At some point in time, an event occurs and causes the object to fall, thus initiating its downward trajectory. At the initial time $t_0$, the object enters into a period of free fall 102. In continuing its free fall 102 journey, the object eventually encounters a surface (e.g., the ground), causing it to halt. The time in which the object makes contact with this halting entity is designated as the final time $t_1$. Consistent with this final time $t_1$, the object simultaneously experiences some degree of shock 103.

The level of shock 103 experienced by the object can come in varying degrees. The impact can have a spectrum ranging from levels of low shock levels to levels of high shock. Additionally, the degree of shock 103 may have a direct correlation to the distance the object has traveled (i.e., the height from which the object has dropped) while in its state of free fall 102.

At this stage, the particular drop distance (i.e., height) is unknown. However, through embodiments of the invention, it can be determined. While the specific details for determining the drop distance (i.e., height) will be discussed in later sections, from the timeline shown in FIG. 1, it becomes clear the unknown value for height can be determined by relating it to the total time T, the object spent within its state of free fall 102. As shown in FIG. 1, the total time T, is equivalent to the duration between the initial time $t_0$, and the final time $t_1$. Using these values, a calculation (which will be discussed later) can be made to determine the drop distance (i.e., height).

In embodiments of the invention, an object may include electronic devices such as tablets, smartphones, cameras, digital compasses, wearable electronics, or any other mobile device comprising electronic capability (i.e., sensors, accelerometers, etc.) for detecting free fall 102. Other non-electronic devices could also be used.

Figure 2:
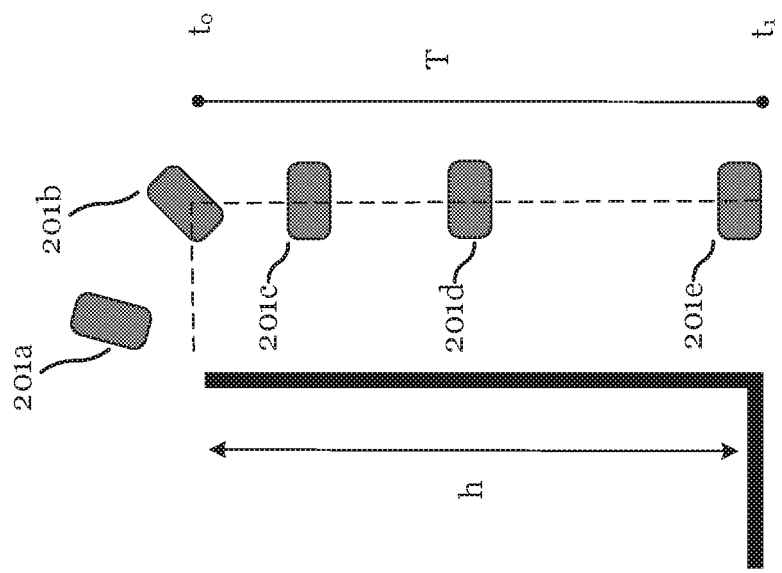
FIG. 2 is an illustration showing characteristic stages of an object before, during, and after a period of free fall, in accordance with an embodiment of the present invention.

FIG. 2 is an illustration showing characteristic stages of an object before, during, and after a period of free fall 102. The initial time $t_0$, the final time $t_1$ and the total time T from the timeline of FIG. 1 are noted on the diagram.

As shown in FIG. 2, an object 201 drops from a certain height h. While the object 201 is suspended in air, it eventually encounters a transitional moment where it is overcome by a state of free fall 102. As mentioned previously, the total time T, in free fall ranges from an initial time $t_0$, to a final time $t_1$. The object 201 is labeled 201a . . . 201e at various points in time.

While the object 201 is on its downward trajectory, it may exhibit various stages corresponding to characteristic free fall signatures. In the initial stage, the object 201a may have just come from being in use or operation. The object 201b enters into a period of free fall 102, designated by the initial time $t_0$. While the object is suspended at the initial time, $t_0$, the initial velocity $v_0$, is zero, that is $$[v_0=0].$$

At this same point in time, there are no additional forces acting upon the object other than the acceleration due to gravity, g. The acceleration due to gravity, g, is a known constant that is equivalent to 9.8 m/s². In embodiments of the invention, the effects due to air resistance are ignored at this stage. It is also possible to adjust the acceleration value to account for other forces such as air resistance.

During free fall, the object is labeled 201c and 201d). At these times, there are no other forces acting upon the object other than the acceleration due to gravity g. Again, any other forces can be compensated for later.

At time $t_1$, the object 201e comes to a stop as it makes contact with a halting entity, such as the ground, a table or whatever. As the object 201 makes contact with the halting entity, it will experience some degree of shock 103. That is, an acceleration (deceleration) will occur upon impact. Also at this final time $t_1$, the final velocity $v_1$, is equivalent to the gravitational constant g, multiplied by the time in free fall, that is $$[v_1=g(t_1-t_0)].$$

The total time T, an object spends in a state of free fall 102 is useful for determining the value of the unknown drop height h. Once the total time T is determined, the value for the height h can be calculated using the kinematic equations of motion.

Total time 106, T, can be expressed as $$[T=t_1-t_0].$$

The acceleration due to gravity g is a known constant. Once the value for the total time T is determined, the drop distance (i.e., height h) can be calculated.

$$[g=2h/T^2]$$

and therefore $$[h=½gT^2].$$

In addition, the velocity at impact v can be calculated as $$[v=gT].$$

The kinematic equations expressed above are useful for determining the drop height h of an object 102 in free fall. As further embodiments of the invention are discussed in later sections, it will be described how the drop height h can be determined through other methodologies involving these equations.

Figure 3:
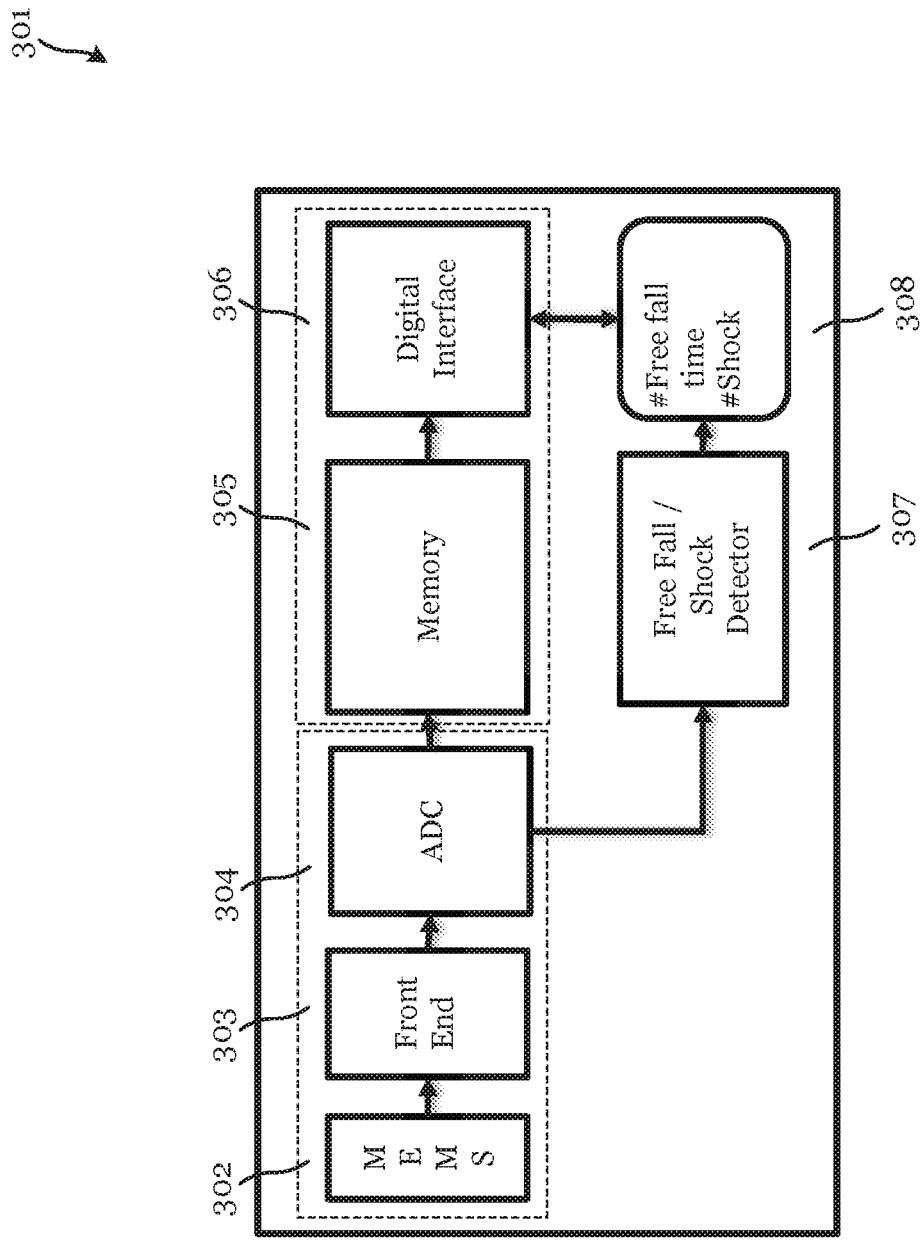
FIG. 3 is a schematic showing components of a sensor used to generate information related to the free fall of an object, in accordance with an embodiment of the present invention.

FIG. 3 is a schematic diagram showing components of a sensor 301 used to generate information related to the free fall 106 of an object, among other things. In one example, a currently available sensor, such as the ST LSM6DSOTR, can be modified or programmed to include the functionality described here. The additional functionality described here can be programmable through the sensor interface.

The sensor 301 may further comprise a micro-electrical mechanical system (MEMS) element 302 responsive to acceleration. For example the MEMS element 302 can include a fixed body capacitively coupled to a movable body. Acceleration could then be measured as a function of changes in capacitance. For example, a MEMS element can include a mass suspended by cantilever beams anchored to a fixed frame and accompanied by fixed plates.

Front end circuit 303 is coupled to an output of the MEMS device. The front end circuit 303 is provided to process the analog signals output form the MEMS element 302. For example, the front end circuit 303 can include elements such as a pre-amplifier and a filter.

An analog-to-digital converter (ADC) 304 is coupled to the output of the MEMS element 302 via the front end circuit 303. The ADC 304 serves to digitize the signals output by the MEMS element 302. Any type of ADC can be utilized, for example, a sigma-delta analog to digital converter.

Memory 305 captures the digital output of the ADC 304 and provides the information to digital interface 306. The memory can include serial registers or an array of registers. For example, the memory can be implemented as a FIFO (first-in first-out) buffer. Any technique to at least temporarily store the digital information will suffice.

The digital interface 306 can utilize the protocol of the system into which it is incorporated. For example, the digital interface 306 can be coupled to an I2C bus, an I3C bus or an SPI bus. Other bus protocols can alternatively be implemented.

The above-referenced elements 302-306 can be found in commercially available accelerometers and are provided here only as an example. A wide variety of other sensor elements can be implemented. For example, piezoelectric or thermal (convective) accelerometers can be utilized instead of a MEMS sensor.

The sensor 301 also includes a free fall detector 307 that is coupled to an output of the ADC 304. The free fall detector 307 can be configured to determine whether the sensor 301 is in a state of free fall based on acceleration information received from the ADC 304. It can also detect when the sensor is no longer in free fall, e.g., detect a moment of shock. The box labeled 308 is provided to indicate the signals that indicate free fall time and shock are provided to the digital interface 306. In other examples, the height calculations can be performed by circuits in the sensor.

In one example, the free fall detector 307 can be implemented as a state machine that uses accelerometer data to determine a time related to distance by using interrupt of free fall and detects mechanical over shock. If a high shock is applied to the device, the device can calculate the time spent during free fall based on interrupt counts measured before the high shock. This information can be stored and used to determine the dropping time and dropping distance of the device.

For example, the state machine of the sensor 301 will increase the number of interrupts and count them while the device is on free fall status. Each interrupt is generated accordance with the frequency of the clock (not shown) of the sensor 301. The free fall time can be used to calculate the free fall distance and velocity as described above. When the mechanical over shock has been detected on the device, an interrupt can be generated to the system by the sensor.

In other embodiments, upon detecting that the sensor 301 is in free fall 102, the free fall detector 307 is configured to issue a signal to the digital interface 306 and receive further acceleration information from the ADC 304 to determine whether a shock 103 is detected based on the further acceleration data. At which point, it will re-issue the signal to the digital interface 306 when a shock 103 is not detected.

As will be discussed below, in embodiments of the invention, the digital interface 306 may be configured to apply an interrupt signal to a microcontroller each time the free fall detector 307 determines the sensor 301 is in a state of free fall 102. This embodiment is useful when the detector 307 does not include a counter.

In various embodiments of the invention, the MEMS element 302, housed within the sensor 301, is a three-axis accelerometer, that is, a sensor that measures three axes of acceleration data. While the object is dropping to the ground, the acceleration data measured along all three axes. Free fall can be sensed when the acceleration measurements at all three axes go to zero. Additionally, the accelerometer can determine when the object is no longer in a period of free fall 102 when it detects the shock (i.e., mechanical impact) the object experiences as it makes contact with a surface.

In one embodiment, a sensor with a programmable finite state machine can provide the ability to be programmed to implement functionality described herein. For example, a sensor can be configured to generate interrupt signals activated by user-defined motion patterns. Such motion patterns can include free fall. In general, the state machine begins with a start state, goes to different states through transitions dependent on the inputs, and can finally end in a specific state. The current state is determined by the past states of the system.

Figure 4:
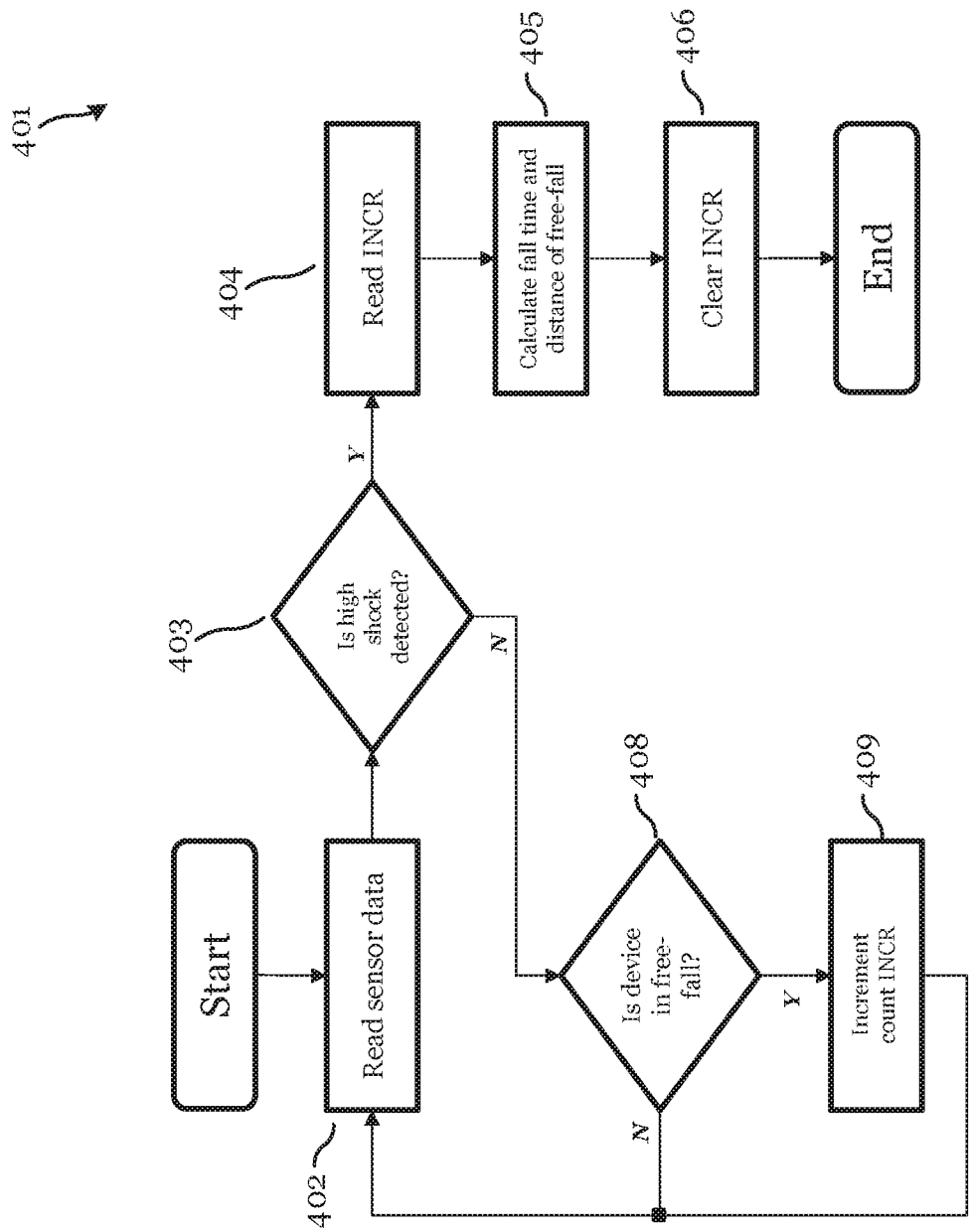
FIG. 4 shows a flow diagram describing a method used to acquire and determine free fall information from a given object, in accordance with an embodiment of the present invention.

FIG. 4 shows a flow diagram describing a method used to acquire, and later determine, free fall information from a given object. Explanation of this embodiment method will be made with additional reference to FIG. 5, which shows the output of a three-axis accelerometer as a function of time. The graphic of FIG. 2 is provided in FIG. 5 for reference.

The method 401 employed by the free fall algorithm may entail sampling the x-, y-, and z-axis output signals from the MEMS element 302. If the acceleration on all three axes is determined to be the result of only gravity for a given duration of time, then the conditions for free fall 102 have been met.

In exemplary embodiments of the invention, sensor 301, e.g., comprised within an object, measures a current acceleration value of the object (step 402) and provides this to height determination circuitry where it is received. Based on the value of the acceleration data, shock (step 403) or free fall (step 402) are met. If neither condition met, the system will take another reading. This sequence will continue until the sensor is in free fall.

Figure 5:
FIG. 5 shows acceleration data generated for an object in free fall once shock detection has occurred, in accordance with an embodiment of the present invention.

As shown in FIG. 5, the object 201 enters free fall at time $t_0$. Since the shock has not been detected, the method will move to step 408 and, since free fall has been detected, to step 409 where the detection is counted. As discussed below, this is most simply performed by incrementing a counter signal INCR.

After the counter is incremented, the sequence will be repeated until the sensor data indicates that the object is no longer in free fall. This is indicated at step 408, where a shock is detected. At this point, it should be recognized that the term "shock" has been used herein to indicate that the object is no longer in free fall. It is understood that a so-called soft landing, e.g., the user catches his phone before hitting the floor, could also be a shock as the term is used here.

Upon determining that free fall has ended, the drop height h (i.e., distance of the fall) can be determined. The final increment count is determined and, from this, the time T of free fall can be determined. The height h of the free fall can be calculated using the formulas described above. The velocity v at impact can also be calculated.

At this point, the counter can be cleared and the process is over (or begins again). The results can be stored in a memory or otherwise utilized.

When an object has fallen, many types of data can be generated. Among the various types, acceleration data is considered one of the most suitable data types for the purpose of free fall 102 detection. The rationale behind this consideration is that an object in acceleration maintains a strong relationship with the force exerting on the object. According to the laws of physics, when there is a free fall 102 event, the exerting force will be changed accordingly. This transitive relationship between the free falling 102 object and the acceleration (due to gravity) gives reasonable justification to utilize acceleration data for free fall 102 determination metrics.

Free fall can be detected based on the analysis of acceleration patterns generated from the object's sensor 301. The acceleration patterns can be extracted from the senor and displayed in a graphical format, as shown in FIG. 5. With the acceleration data presented as a graphical representation, the system can distinguish between the different characteristic free fall signatures (i.e., free fall motions) described earlier.

Some important features of the acceleration data have been encircled. Namely, the total time T that the object was in a period of free fall 102 is shown highlighted by the encircled area 106. Additionally, the duration that the object encountered shock is shown by the second encircled area 103. Information from these particular features can be extracted from the acceleration data. Once the data is extracted, it can be used for various calculations.

In one embodiment, the detector 307 of FIG. 3 is a state machine that implements the flow diagram of FIG. 4. In one example, the state machine implements the steps 402, 403, 408 and 409 while an external system component (e.g., a microcontroller) implements steps 404, 405 and 406. In another example, the sensor 301 includes circuitry to perform all of the steps.

Figure 6:
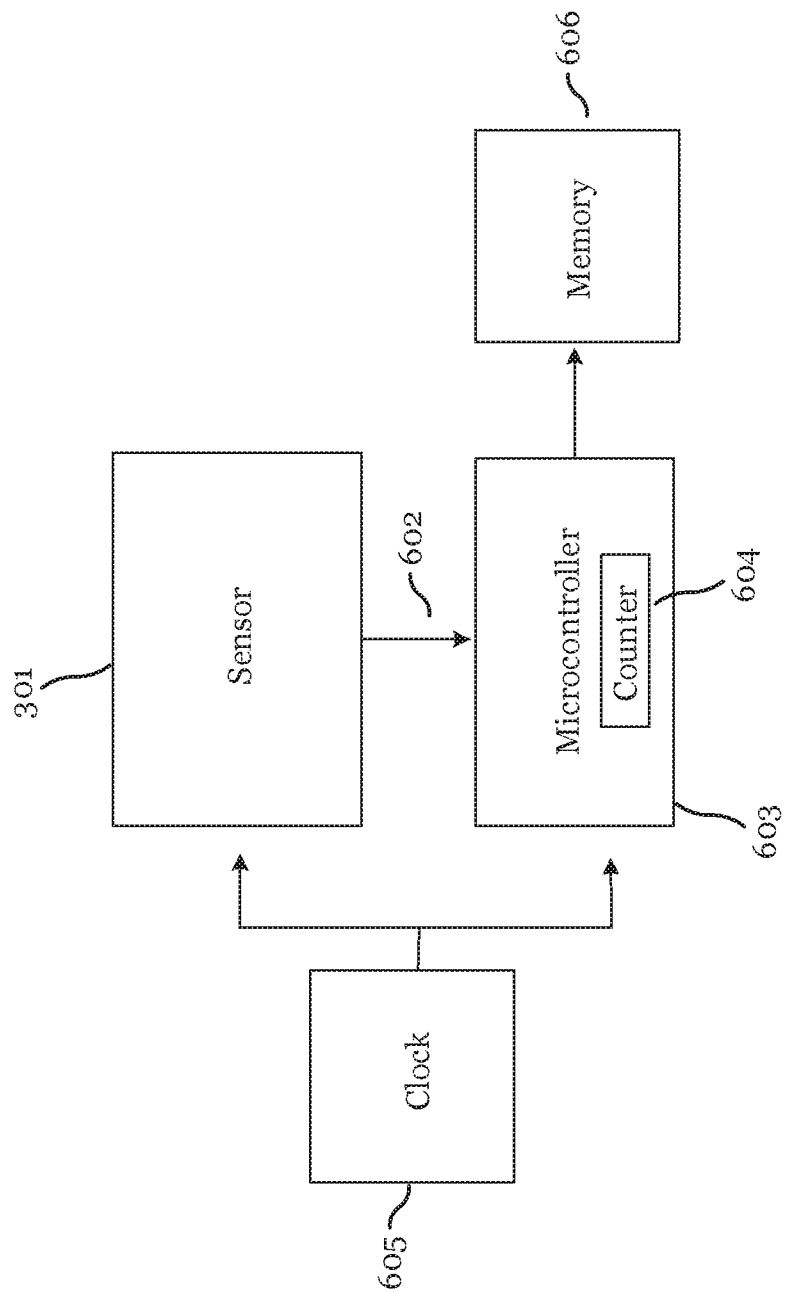
FIG. 6 is a flow diagram showing the different microcomponents comprising the sensing unit of an electronic object, in accordance with an embodiment of the present invention.

In another embodiment, the sensor 301 detects the free fall shock conditions and provides this information to an external system component that counts the cycles and calculates the relevant information. FIG. 6 is a simplified schematic diagram showing an example of such a system.

Referring to FIG. 6, an acceleration sensor 301 is configured to determine whether the object is in free fall as discussed above. The sensor 301 operates in conjunction with a microcontroller 603, which is coupled to the acceleration sensor 301 through a digital bus 602. The microcontroller 603 is configured to receive interrupt signals 602 from the sensor 601 at each clock cycle that the sensor 301 determines that the object is in free fall 102. The number of interrupt signals can be tracked by incrementing a counter 604 in response to each interrupt signal 602. The functionality can be performed synchronously based on a clock from clock circuitry 605.

The microcontroller 603 can perform the calculations necessary to determine the height h and velocity v. According to embodiments of the invention, the system may further comprise a memory 606, e.g., a non-volatile memory such as a flash memory. The microcontroller 603 is configured to store information related to a final counter 604 value after the acceleration sensor 301 determines that the object is no longer in a state of free fall 102. This information could include the number of clock cycles, the duration of the free fall period, and/or the calculated height.

In other embodiments, the various functions can be allocated in a different manner. For example, as discussed above, the counter and/or processing circuit for determining the fall height can be included in the sensor 301 as noted above. In another embodiment, the microcontroller can be implemented to receive the acceleration data directly from the sensor and detect the free fall from that data. In general, the distribution of functions can vary.

Figure 7:
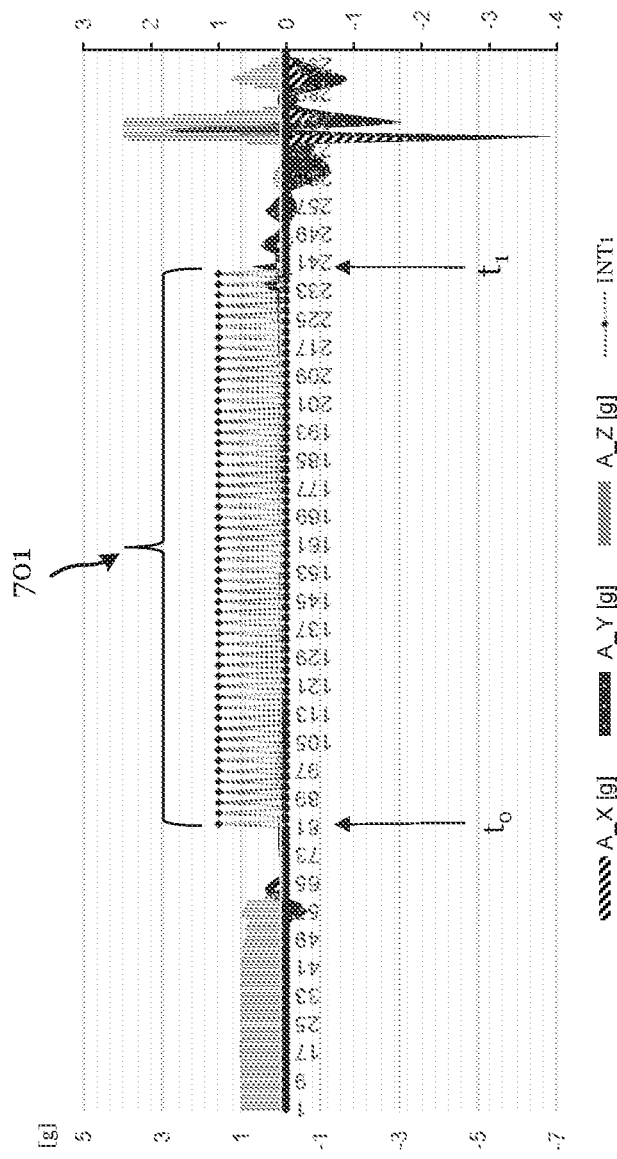
FIG. 7 shows acceleration data for an object in free fall after interrupt signal data has been generated, in accordance with an embodiment of the present invention.

FIG. 7 shows a particular example to illustrate operation of a system in accordance with embodiments described herein. As with FIG. 5, the graph shows the three-axis acceleration measurements from sensor 301. The object is in free fall when the acceleration measured at all three axes goes to zero. This occurs at time $t_0$.

When an object is in a state of free fall, an algorithm employed by the senor 301 causes the sensor 301 to generate an interrupt signal 701 at each clock signal when free fall is still detected. Alternatively, the interrupts can be generated at periodic clock cycles, e.g., every ten cycles. Any pattern of interrupts can be used.

Upon generation of the interrupt signal 701, a counter 604 in the sensor 301 or microcontroller 603 is incremented to keep track of the number of interrupt signals 701 that have been generated. The interrupt signals 701 continue to be generated by the sensor synchronously with clock signal from the clock 6o5. The interrupt signals 701 cease upon determination that the object is no longer in free fall. Alternatively, the sensor may generate a signal that explicitly indicates that shock has been detected.

In order to determine the value for height h, the microcontroller 603 can calculate the fall time T (i.e., $t_1$-$t_0$) from the number interrupt signals 701. For example, if the system clock operated at 104 Hz and the interrupt signals 701 are output at each clock cycle, the time interval between interrupt signals will be 9.6 msec. Assume that final count value is 157 indicating the number of interrupt signals. Accordingly, the total time T is calculated to be 1538.6 msec as follows:

$$[T=157 \text{ interrupts}*9.6 \text{ msec/interrupt}=1538.6 \text{ msec}].$$

As is universally known, the acceleration due to gravity g is equal to 9.80665 m/s². As noted earlier, the height h can be calculated using the equation $$[h=½gT^2] \text{ or}$$

$$[h=½*9.8 \text{ m/s}^2*(1539 \text{ msec})^2=11.6 \text{ m}]$$

In addition, the velocity at impact v can be calculated as $$[v=gT] \text{ or}$$

$$[v=9.8 \text{ m/s}^2*1539 \text{ msec}=15 \text{ m/s}].$$

Different implementations of embodiments of the invention have been described. In particular, three scenarios have been disclosed: 1) the sensor counts clock cycles and sends the number of cycles to the microcontroller so that the microcontroller calculate the time and dropping distance, 2) the sensor not only counts cycles but also calculates the time and/or the dropping distance, and 3) the sensor only outputs interrupts to the microcontroller so that the microcontroller can count cycles and calculate the time and dropping distance. It is understood that other variations can also be utilized.

In one example, this object including the sensor 301 can be a smart phone. When the phone is dropped and incurs a mechanical shock when crashing to the ground, the dropped distance and shock amount could be useful information. If the device is broken, this information can explain what was happened to the device. Such information can be used in designing ruggedness of future versions or for warranty verification, as examples.

The object can also be any other type of device, whether electronic or not. For example, a height measurement device can be implemented using a sensor and controller as described herein along with a transmitter. The device could be dropped from an unknown height. The height could then be calculated as described herein and then transmitted back. Other implementations are also possible.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
   measuring an acceleration value of an object, the measuring being performed by a sensor attached to the object;
   determining the object is in a free fall based on the acceleration value;
   issuing an increment signal, by the sensor, in response to determining that the object is in free fall, the increment signal being issued synchronously with a clock signal;
   incrementing a counter in response to each issuance of the increment signal;
   measuring a further acceleration value of the object using the sensor;
   detecting a shock based on the further acceleration value; and
   cease issuing the incremental signal in response to detecting the shock.

2. The method of claim 1, further comprising determining a distance of the free fall based on a counter value taken after the shock has been detected and a frequency of the clock signal.

3. The method of claim 1, further comprising storing information related to a counter value taken after the shock has been detected, the information being stored in a non-volatile memory.

4. The method of claim 3, further comprising determining a distance of the free fall based on the information stored in the non-volatile memory.

5. The method of claim 3, further comprising determining information related to a drop based on the stored information and verifying warranty availability based on the determined information.

6. The method of claim 1, further comprising, after the shock has been detected, resetting the counter and then repeating the method of claim 1.

7. The method of claim 1, wherein the issuing of the increment signal comprises applying an interrupt signal to a microcontroller.

8. The method of claim 7, wherein the counter is incorporated in the microcontroller, and wherein the incrementing of the counter in response to each issuance of the increment signal comprises incrementing the counter in the microcontroller in response to each issuance of the increment signal.

9. A sensor comprising:
   a MEMS element responsive to acceleration;
   an analog-to-digital converter coupled to an output of the MEMS element;
   a free fall detector coupled to an output of the analog-to-digital converter, the free fall detector configured to determine whether the sensor is in free fall based on acceleration information received from the analog-to-digital converter wherein the free fall detector comprises a state machine configured to
      read sensor data from the MEMS element,
      determine whether the sensor has experienced a shock based on the sensor data,
      when the sensor has not experienced the shock, determine whether the sensor is in free fall,
      when the sensor has not experienced the shock and after determining the sensor is in free fall, generate an increment signal synchronously with a clock signal, and
      when the sensor has experienced the shock, determine that the free fall has ended; and
   a digital interface coupled to the analog-to-digital converter and to an output of the free fall detector, the digital interface configured to issue an output related to free fall information determined by the free fall detector.

10. The sensor of claim 9, wherein the state machine includes a counter that counts a number of increment signals, the state machine further configured to:
    determine a final count of the increment signals from the counter; and
    reset the counter to zero.

11. The sensor of claim 10, wherein the state machine is further configured to calculate free fall information based on the final count, the free fall information comprising a drop height or a final drop velocity.

12. The sensor of claim 9, further comprising a memory element coupled between the analog-to-digital converter and the digital interface and front end circuitry coupled between the MEMS element and the analog-to-digital converter.

13. The sensor of claim 9, wherein the digital interface is configured to issue the output each time the free fall detector determines that the sensor is in free fall.

14. The sensor of claim 9, wherein, upon detecting that the sensor is in free fall, the free fall detector is configured to:
    issue a signal to the digital interface;
    receive further acceleration information from the analog-to-digital converter;
    determine whether the shock is detected based on the further acceleration information; and
    re-issue the signal to the digital interface when the shock is not detected.

15. The sensor of claim 14, wherein the digital interface is configured to apply an interrupt signal to a microcontroller each time the free fall detector determines that the sensor is in free fall.

16. An object comprising:

clock circuitry;

an acceleration sensor configured to determine whether the object is in free fall at points in time synchronous with a clock signal of the clock circuitry and configured to determine whether the acceleration sensor has experienced a shock; and a microcontroller coupled to the acceleration sensor through a digital bus, the microcontroller configured to receive an interrupt signal from the acceleration sensor at each point in time that the acceleration sensor determines that the object is in free fall and to increment a counter in response to each interrupt signal.

17. The object of claim 16, wherein the acceleration sensor comprises:

a MEMS element responsive to acceleration;

an analog-to-digital converter coupled to an output of the MEMS element;

a free fall detector coupled to an output of the analog-to-digital converter, the free fall detector configured to determine whether the object is in free fall based on acceleration information received from the analog-to-digital converter; and a digital interface coupled to the analog-to-digital converter, to an output of the free fall detector, and to the digital bus.

18. The object of claim 16, further comprising a non-volatile memory, the microcontroller configured to store information related to a final counter value in the non-volatile memory after the acceleration sensor determines that the object is no longer in free fall.

19. The object of claim 18, wherein the object comprises a communication device, the information stored in the non-volatile memory being usable to determine information related to a damage condition of the communication device.

* * * * *